(12) United States Patent
Sharma et al.

(10) Patent No.: US 12,557,323 B2
(45) Date of Patent: Feb. 17, 2026

(54) ENHANCEMENT MODE TRANSISTOR WITH A ROBUST GATE AND METHOD

(71) Applicant: GlobalFoundries U.S. Inc., Malta, NY (US)

(72) Inventors: Santosh Sharma, Austin, TX (US); Mark D. Levy, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 468 days.

(21) Appl. No.: 18/065,674

(22) Filed: Dec. 14, 2022

(65) Prior Publication Data

US 2024/0204090 A1    Jun. 20, 2024

(51) Int. Cl.
*H10D 30/47*       (2025.01)
*H10D 30/01*       (2025.01)
(Continued)

(52) U.S. Cl.
CPC ......... *H10D 30/475* (2025.01); *H10D 30/015* (2025.01); *H10D 62/113* (2025.01); *H10D 62/161* (2025.01); *H10D 62/8503* (2025.01)

(58) Field of Classification Search
CPC .. H10D 30/475; H10D 30/015; H10D 62/113; H10D 62/161; H10D 62/8503; H10D 84/01; H10D 84/05; H10D 84/82; H10D 62/124; H10D 64/01; H10D 64/411; H10D 64/511; H10D 64/517; H10D 30/47;
(Continued)

(56) References Cited

U.S. PATENT DOCUMENTS 9,147,760 B2    9/2015    Mishra et al.
2014/0203288 A1    7/2014    Hsiung
(Continued)

FOREIGN PATENT DOCUMENTS

WO    2022113536 A1    6/2022

OTHER PUBLICATIONS

European Search Report for corresponding EP Application No. 23204762.1-1211 dated Apr. 23, 2024, 9 pages.
Jeong et al., "P-GaN / AlGAN / GaN E-mode HEMT," Mar. 22, 2019, 28 pages.
(Continued)

*Primary Examiner* — William B Partridge
*Assistant Examiner* — David Paul Sedorook
(74) *Attorney, Agent, or Firm* — Francois Pagette; Hoffman Warnick LLC

(57) ABSTRACT

A disclosed structure includes an enhancement mode high electron mobility transistor (HEMT). The HEMT includes a barrier layer with a thick portion positioned laterally between thin portions and a gate. The gate includes a semiconductor layer (e.g., a P-type III-V semiconductor layer) on the thick portion of the barrier layer and having a thick portion positioned laterally between thin portions. The gate also includes a gate conductor layer on and narrower than the thick portion of the semiconductor layer, so end walls of the gate are stepped. Thin portions of the barrier layer near these end walls minimize or eliminate charge build up in a channel layer below. To block current paths around the gate, isolation regions can be below the thin portions of the barrier layer offset from the semiconductor layer. The structure can further include alternating e-mode and d-mode HEMTs. Also disclosed are associated method embodiments.

20 Claims, 14 Drawing Sheets

(51) Int. Cl.
*H10D 62/10* (2025.01)
*H10D 62/13* (2025.01)
*H10D 62/85* (2025.01)

(58) Field of Classification Search
CPC .............. H10D 64/256; H10D 62/343; H01L 29/7786; H01L 29/778; H01L 29/66462; H01L 29/42316; H01L 29/42372; H01L 29/41766; H01L 29/4232; H01L 29/401; H01L 29/2003; H01L 29/1066; H01L 27/085; H01L 27/0605; H01L 21/8252; H01L 29/0642; H01L 29/0891

See application file for complete search history.

(56) References Cited

U.S. PATENT DOCUMENTS

| | | | |
|---|---|---|---|
| 2014/0252490 A1* | 9/2014 | Usujima | H01L 21/26586 |
| | | | 438/296 |
| 2019/0207018 A1* | 7/2019 | Makiyama | H10D 30/015 |
| 2020/0350399 A1* | 11/2020 | Wong | H10D 62/343 |
| 2020/0357909 A1* | 11/2020 | Udrea | H10D 62/8503 |
| 2022/0352337 A1* | 11/2022 | Li | H10D 62/343 |
| 2023/0420517 A1* | 12/2023 | Otake | H10D 64/111 |

OTHER PUBLICATIONS

Singisetti et al., "Enhancement-Mode N-Polar GaN MISFETs With Self-Aligned Source/Drain Regrowth," IEEE Electron Device Letters, vol. 32, No. 2, Feb. 2011, pp. 137-139.

* cited by examiner

ENHANCEMENT MODE TRANSISTOR WITH A ROBUST GATE AND METHOD

GOVERNMENT LICENSE RIGHTS

This invention was made with government support under contract number HQ0727790700 and awarded by the United States Defense Microelectronics Activity (DMEA) and the United States Defense Advanced Research Projects Agency (DARPA). The government has certain rights in the invention.

BACKGROUND

The present disclosure relates to transistors, and, more particularly, to embodiments of a semiconductor structure including an enhancement mode (e-mode) high electron mobility transistor (HEMT) with a robust gate and to embodiments of a method of forming the structure.

HEMTs have emerged as a leading technology for radio frequency (RF) and millimeter wave (mmWave) (e.g., 3-300 GHz) wireless applications. Such HEMTs are normally depletion mode (d-mode) devices that can be modified to form enhancement mode (e-mode) devices. However, currently available e-mode HEMTs suffer from reliability issues.

SUMMARY

Disclosed herein are embodiments of a semiconductor structure. The semiconductor structure can include a barrier layer with a first barrier portion positioned laterally between and thicker than second barrier portions. The semiconductor structure can further include a gate. The gate can include a semiconductor layer and a gate conductor layer. The semiconductor layer can be on the first barrier portion and can have, above the first barrier portion, a first semiconductor portion positioned laterally between and thicker than second semiconductor portions. The gate conductor layer can be on and narrower in width than the first semiconductor portion.

Some embodiments of the semiconductor structure disclosed herein can include a barrier layer with alternating first barrier portions and second barrier portions. Each first barrier portion can be positioned laterally between and thicker than the adjacent second barrier portions. The semiconductor structure can further include multiple gates. Each gate can include a semiconductor layer and a gate conductor layer. The semiconductor layer can be on a first barrier portion and can have, above the first barrier portion, a first semiconductor portion positioned laterally between and thicker than second semiconductor portions. The gate conductor layer can be on and narrower in width than the first semiconductor portion. The semiconductor structure can further include a conformal dielectric layer over the gates and further on the second barrier portions on opposing sides of the gates.

Also disclosed herein are method embodiments for forming such semiconductor structures. For example, a disclosed method embodiment can include forming a barrier layer and forming a gate above the barrier layer. The gate can be formed so as to include a semiconductor layer and a gate conductor layer, as described below. The semiconductor layer can be on a first barrier portion of the barrier layer, which is between and thicker than second barrier portions. Additionally, the semiconductor layer can have, above the first barrier portion, a first semiconductor portion positioned laterally between and thicker than second semiconductor portions. The gate conductor layer can be on and narrower in width than the first semiconductor portion.

BRIEF DESCRIPTION OF THE DRAWINGS

The present disclosure will be better understood from the following detailed description with reference to the drawings, which are not necessarily drawn to scale and in which.

DETAILED DESCRIPTION

Figure 1A:
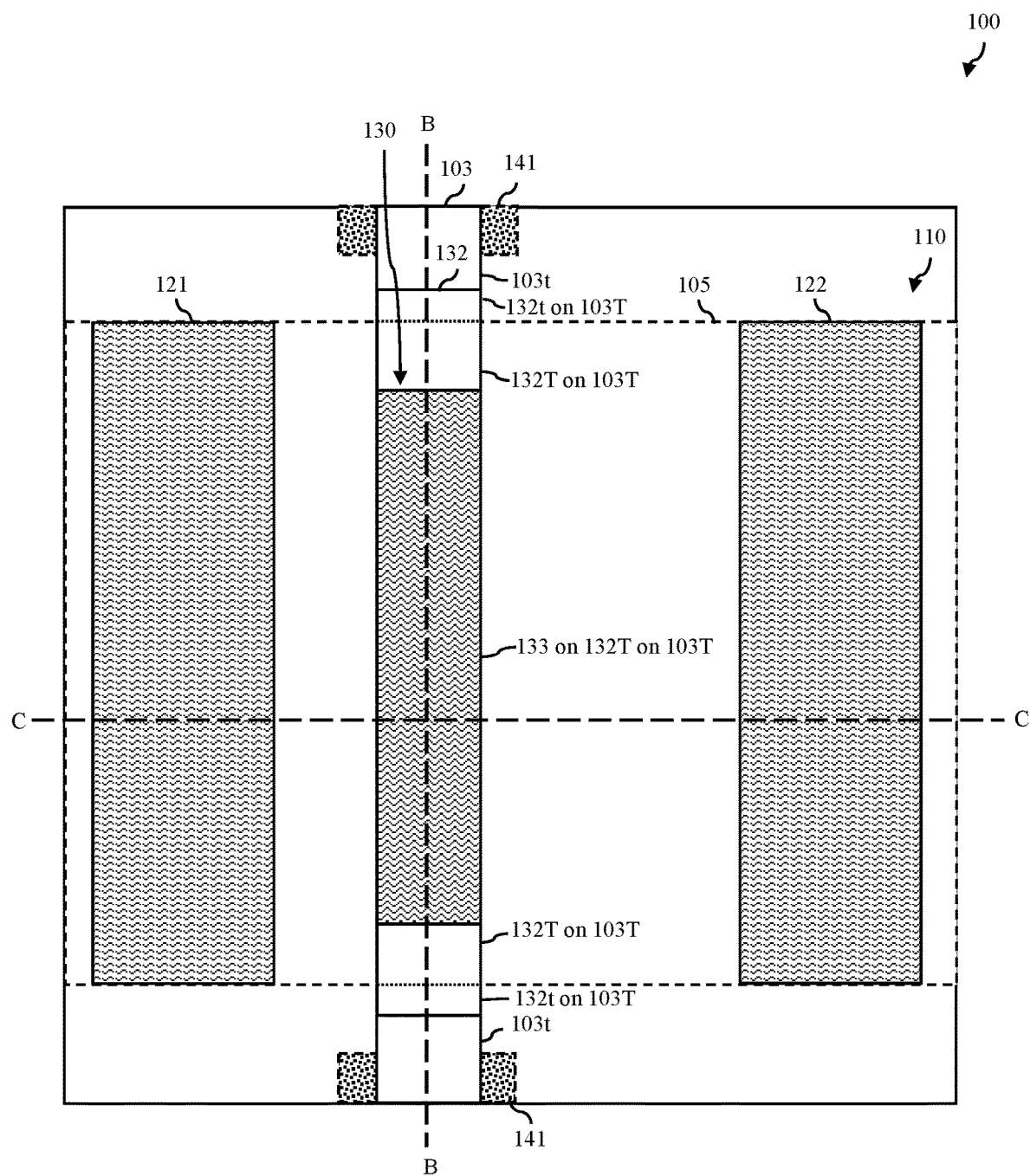
FIG. 1A is a layout diagram and FIGS. 1B and 1C are different cross-section diagrams of a disclosed embodiment of a semiconductor structure.

As mentioned above, HEMTs, have emerged as a leading technology for RF and mmWave wireless applications. Those skilled in the art will recognize that conventional HEMTs are typically d-mode devices. A d-mode HEMT refers to a HEMT that is normally in an ON-state (i.e., conductive) and only switches to an OFF-state (i.e., becomes non-conductive) when a voltage is applied to the gate of the HEMT. This is due to a zero-bias two-dimensional electron gas (2DEG) below the gate and, particularly, between the barrier and channel layers of the HEMT. The gate can, however, be modified to form an e-mode HEMT. An e-mode HEMT refers to HEMT that is normally in an OFF-state (i.e., non-conductive) and only switches to an ON-state (i.e., becomes conductive) when a voltage is applied to the gate. One technique for modifying the gate of a d-mode HEMT to form an e-mode HEMT is to insert a P-type III-V semiconductor layer (e.g., a magnesium (Mg)-doped gallium nitride (GaN) layer or some other suitable P-type III-V semiconductor layer) into the gate (e.g., above the barrier layer and below the gate metal) in order to suppress the zero-bias 2DEG. However, as mentioned above, currently available e-mode HEMTs suffer from reliability issues. The inventors have determined that the reliability issues stem from gate degradation caused by implant isolation region formation. Specifically, during HEMT processing, gate formation on a barrier layer is followed by formation of implant isolation region(s) in a channel layer below the barrier layer. The implant isolation region(s) are formed using a dopant implantation process so that they are located below one or both ends of the gate and so that they block potential current path(s) between the source/drain regions that would otherwise bypass the portion of the channel layer below the gate by wrapping around the end(s) of the gate. Such current path(s) are created due to charge build up in the channel layer under the barrier layer and the implant isolation region(s) effectively eliminate the charge. In e-mode HEMTs, the dopant is implanted through the P-type III-V semiconductor layer at the end(s) of the gate and, as a result, causes gate degradation and, thereby reliability issues.

In view of the foregoing, disclosed herein are embodiments of a semiconductor structure including at least one enhancement mode (e-mode) high electron mobility transistor (HEMT) with a robust gate to minimize reliability issues. Specifically, the e-mode HEMT can include a barrier layer on a channel layer. The barrier layer can have a thick portion positioned laterally between thin portions. The e-mode HEMT can also include a gate. The gate can be positioned laterally between, separated from, and parallel to source/drain terminals and can traverse the width of an active device region. The gate can include a semiconductor layer (e.g., a P-type III-V semiconductor layer, such as an Mg-doped GaN layer) on the thick portion of the barrier layer. The semiconductor layer can include a thick portion positioned laterally between thin portions. The gate can further include a gate conductor layer on and narrower in width than the thick portion of the semiconductor layer. Thus, opposing end walls of the gate are stepped and the thin portions of the barrier layer near the end walls minimize or eliminate charge build up in the channel layer that could potentially result in a current path around the gate. As a result, implant isolation regions in the channel layer may be unnecessary. However, if necessary to block potential current paths around the gate, implant isolation regions can be aligned below the thin portions of the barrier layer. They will not need to be as deep because charge build up will be reduced due to the relatively thin barrier layer in the area. Additionally, they can be completely offset from the semiconductor layer of the gate due to the stepped end walls and, thus, gate degradation due to dopants implanted through the semiconductor layer of the gate is avoided and the gate of the HEMT remains robust. In some embodiments, the semiconductor structure can further include alternating e-mode and d-mode HEMTs with shared source and drain terminals, where the e-mode HEMTs similarly have robust gates. Also disclosed herein are method embodiments for forming the disclosed semiconductor structures.

Figure 1B:
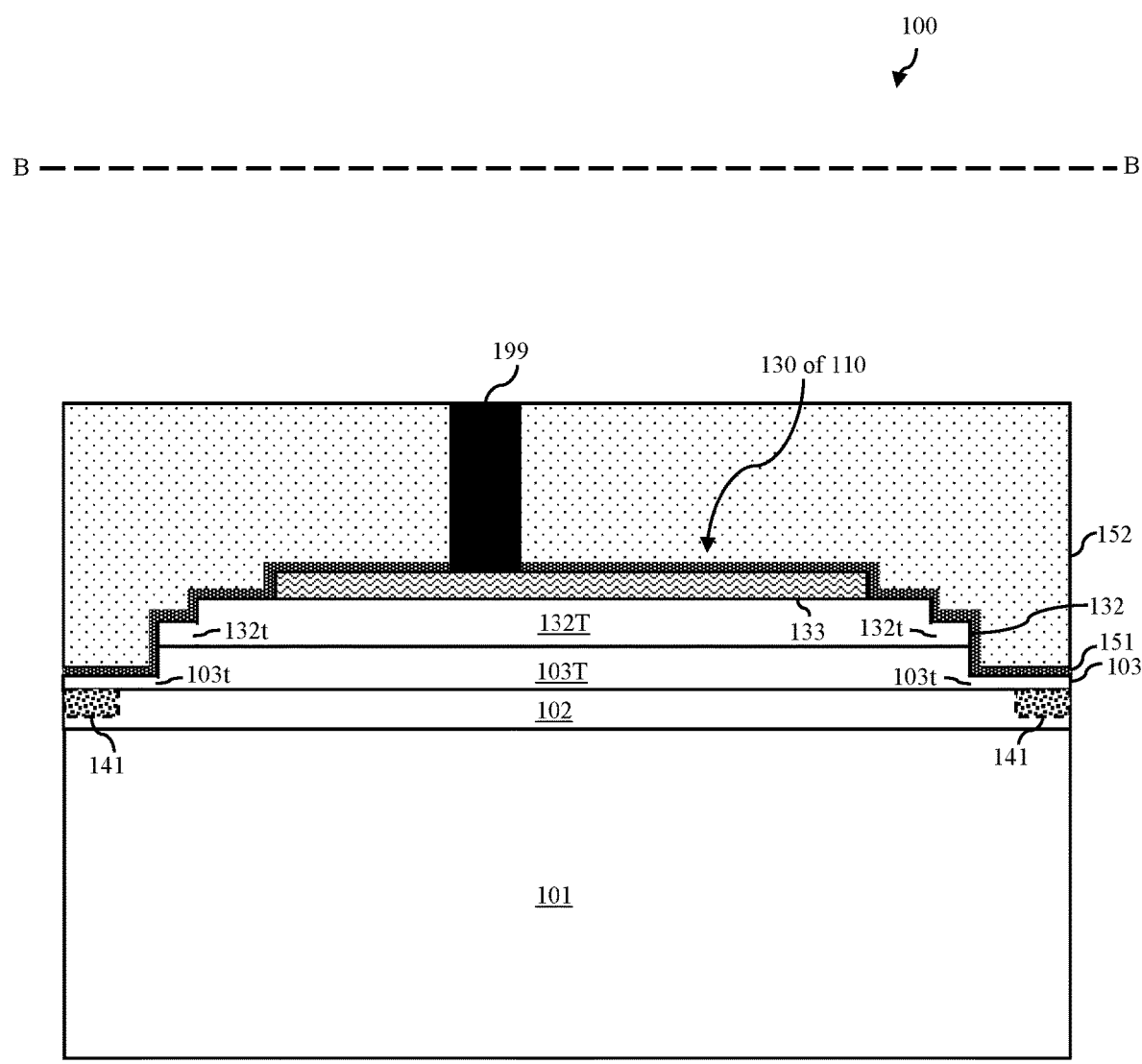
Figure 1C:
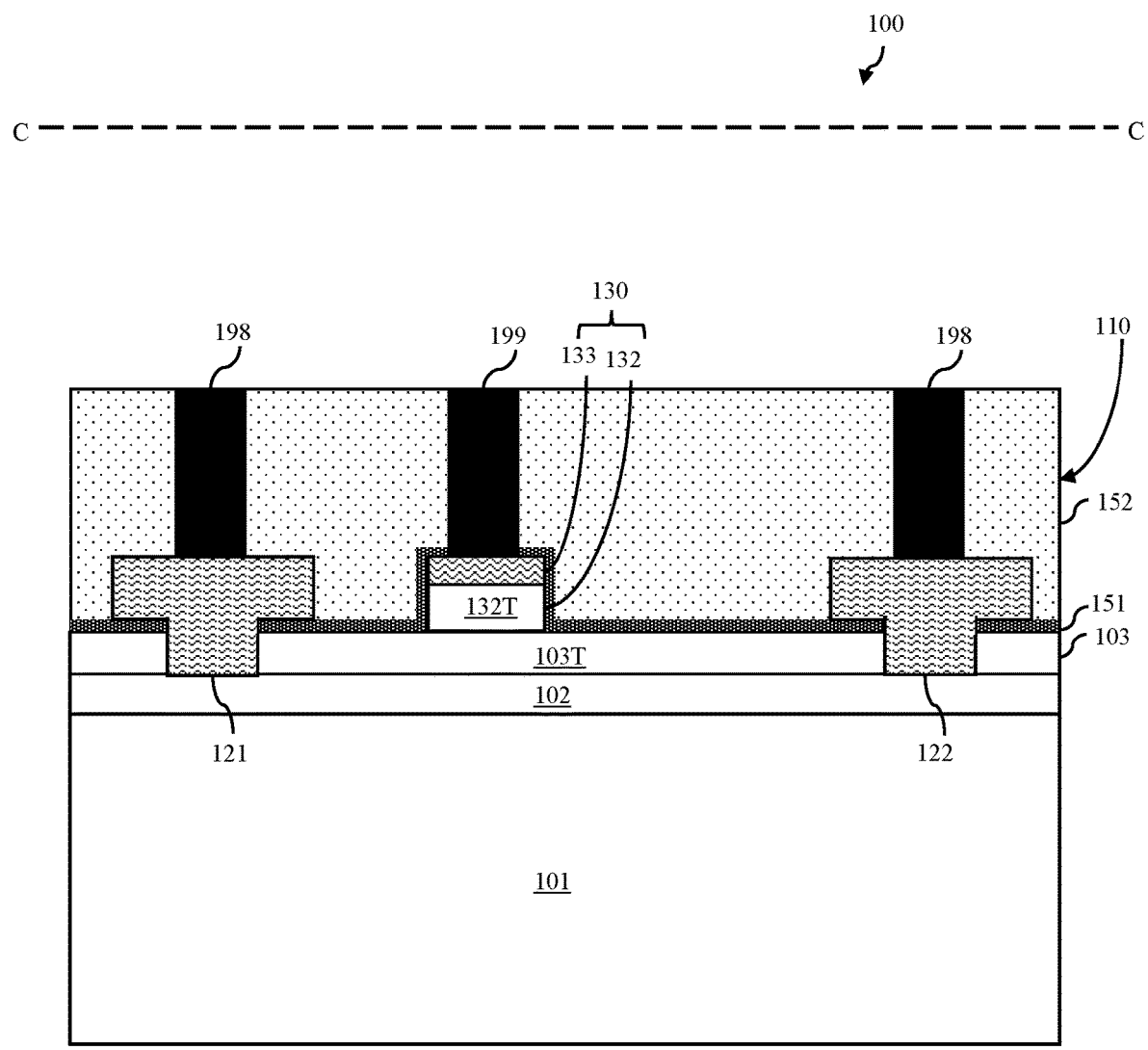
Figure 2A:
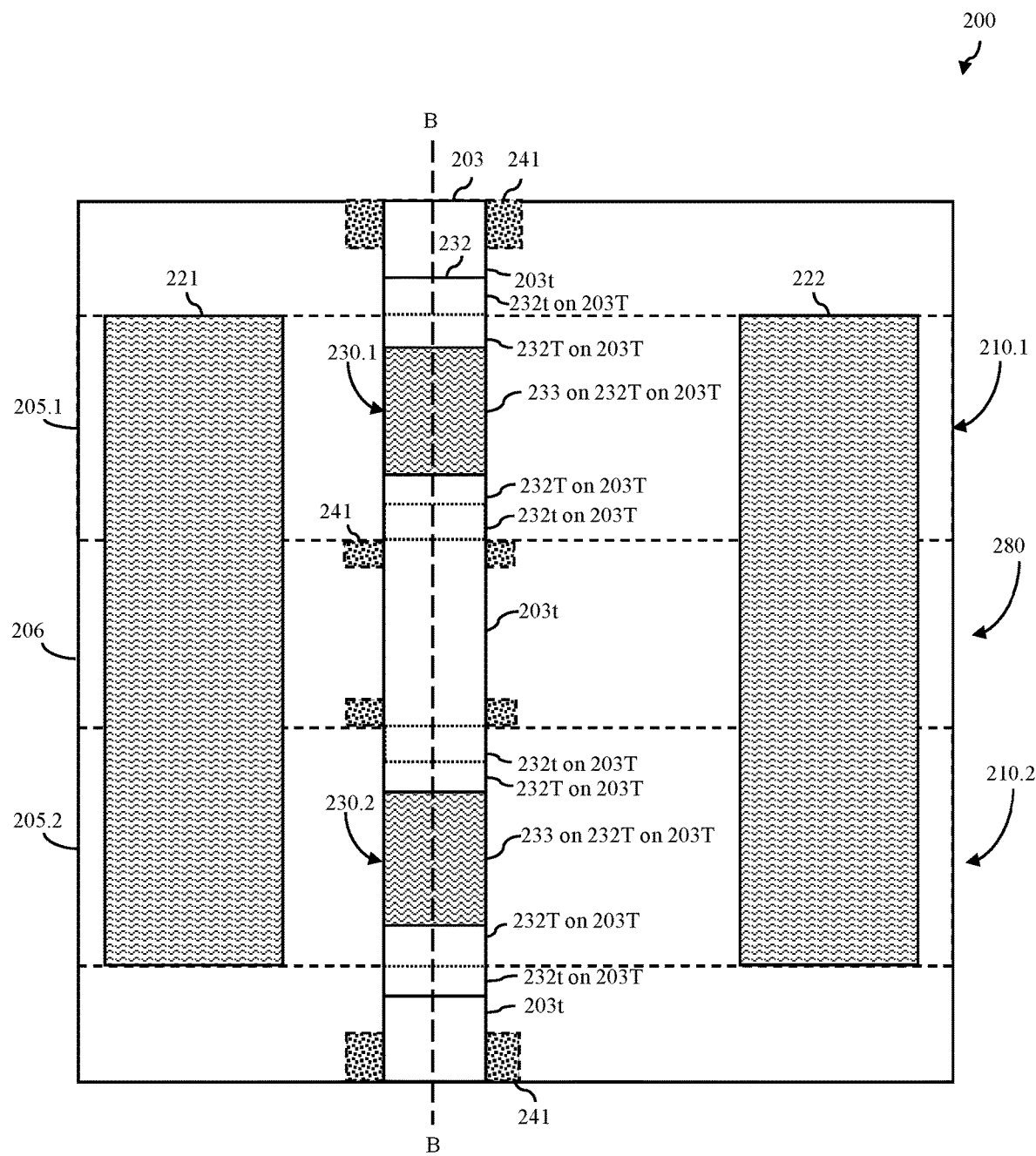
FIG. 2A is a layout diagram and FIG. 2B is a cross-section diagram of another disclosed embodiment of a semiconductor structure.
Figure 2B:
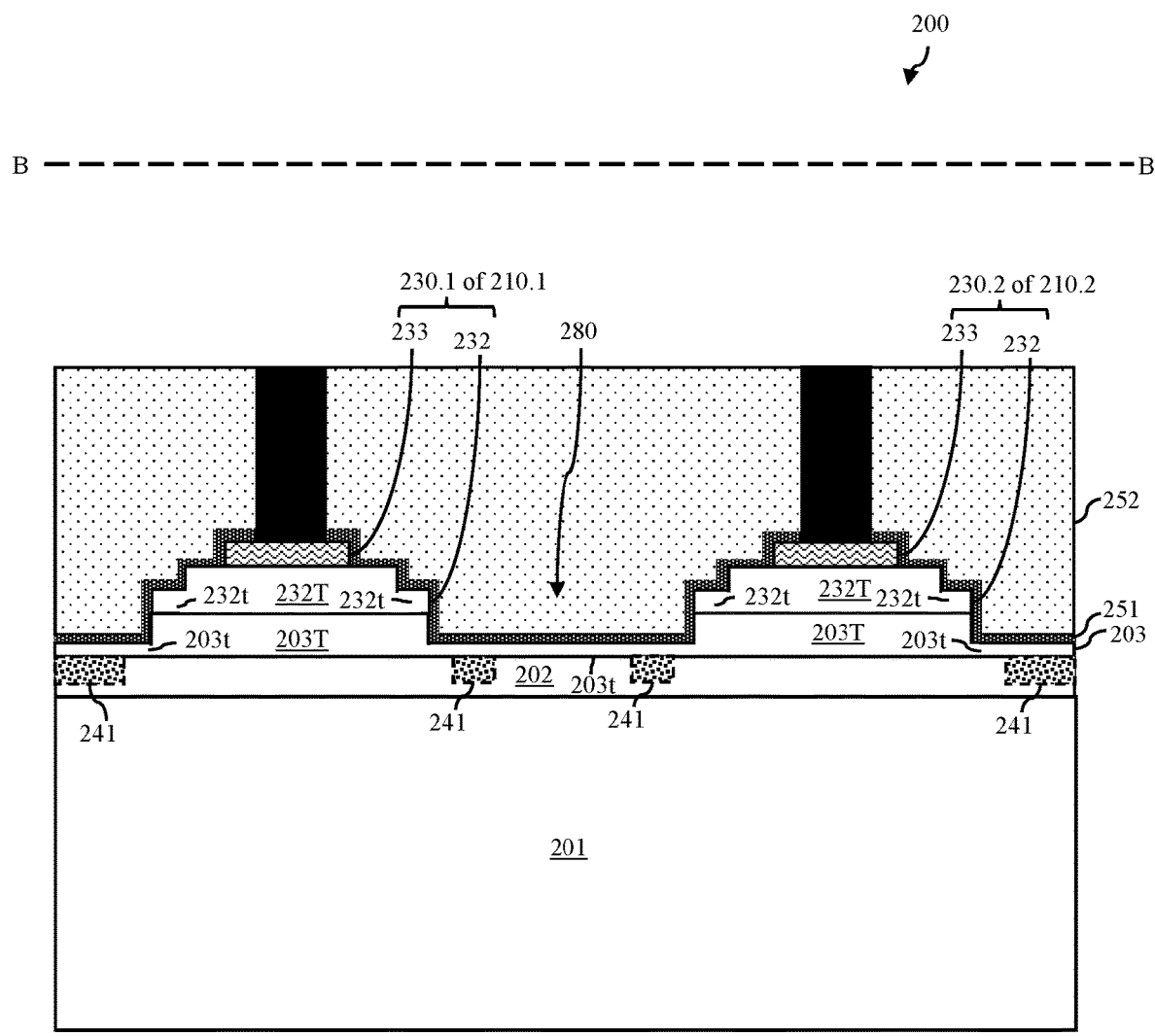
Figure 3A:
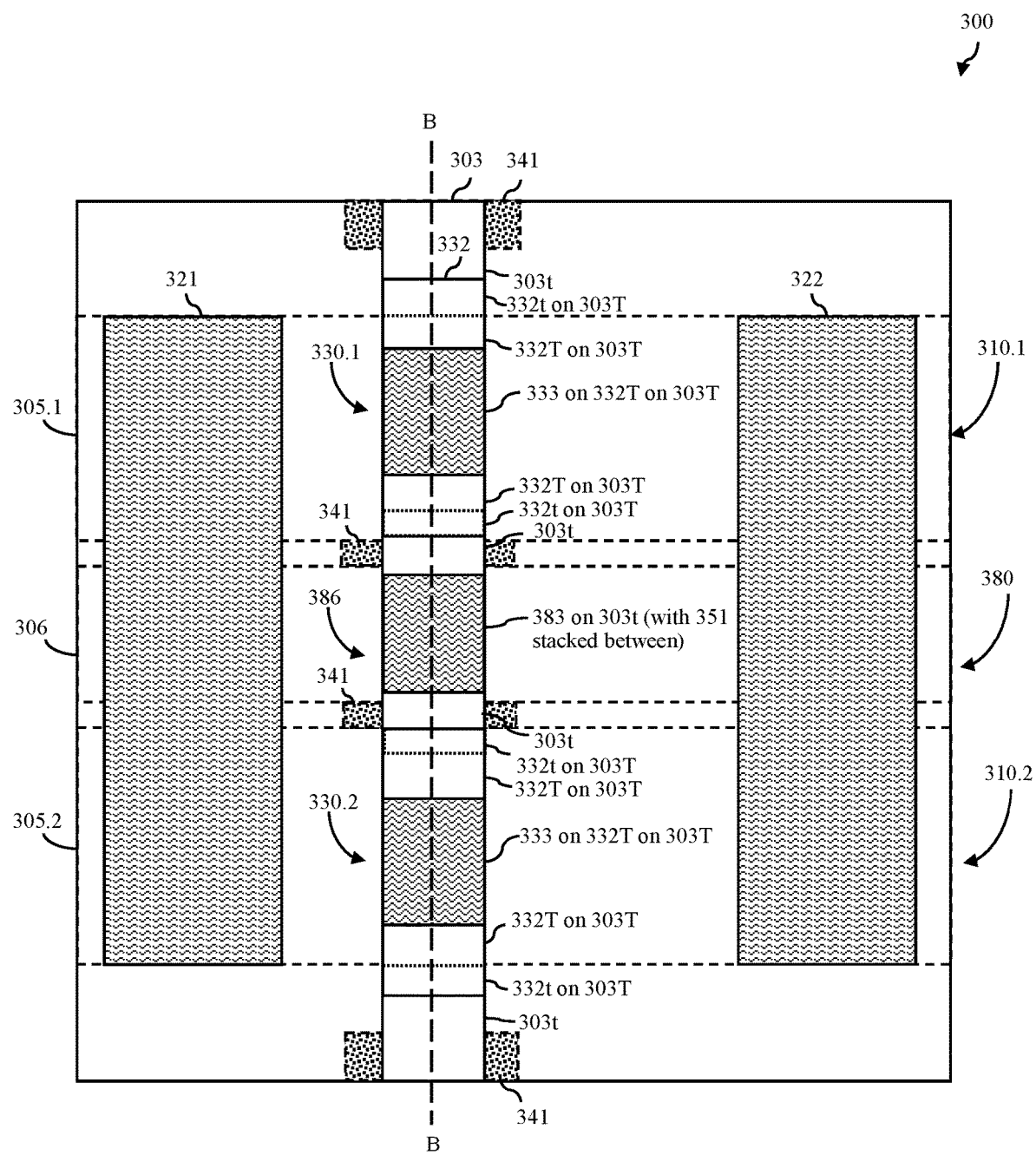
FIG. 3A is a layout diagram and FIG. 3B is a cross-section diagram of yet another disclosed embodiment of a semiconductor structure.
Figure 3B:
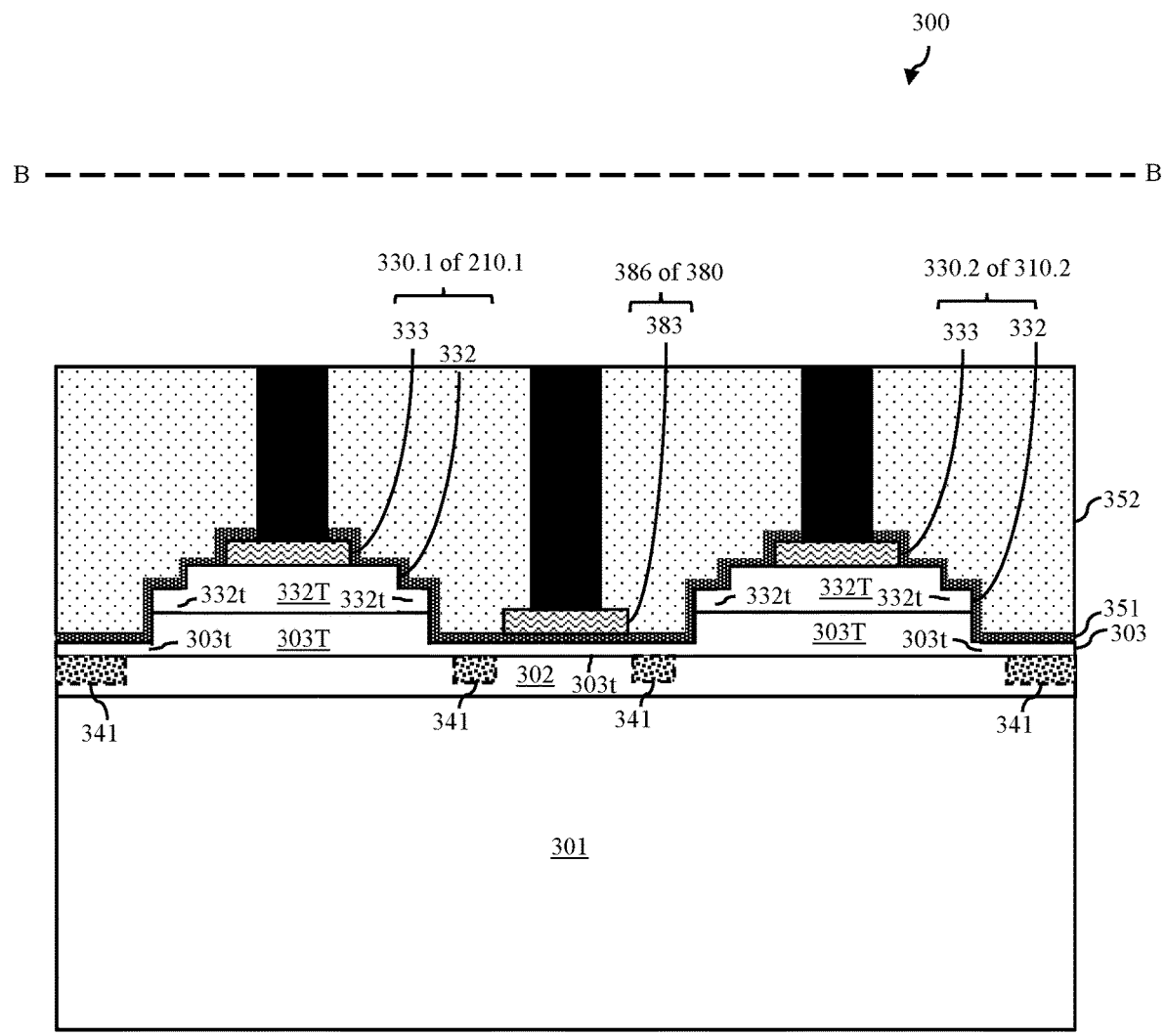

More particularly, FIG. 1A is a layout diagram and FIGS. 1B and 1C are different cross-section diagrams of an embodiment of a semiconductor structure 100 including an e-mode HEMT 110. FIG. 2A is a layout diagram and FIG. 2B is a cross-section diagram of another embodiment of a semiconductor structure 200 including alternating parallel e-mode and d-mode HEMTs (e.g., see e-mode HEMTs 210.1 and 210.2 and d-mode HEMT 280, which is without a gate, between the e-mode HEMTs). FIG. 3A is a layout diagram and FIG. 3B is a cross-section diagram of yet another embodiment of a semiconductor structure 300 including alternating parallel e-mode and d-mode HEMTs (e.g., see e-mode HEMTs 310.1 and 310.2 and d-mode HEMT 380 between the e-mode HEMTs).

Each semiconductor structure 100, 200, 300 can include a substrate 101, 201, 301. The substrate 101, 201, 301 can be, for example, a silicon (Si) or Si-based substrate (e.g., a silicon carbide (SiC) substrate), a sapphire substrate, a III-V semiconductor substrate (e.g., a GaN substrate or some other suitable III-V semiconductor substrate) or any other suitable substrate for a III-V semiconductor device. Those skilled in the art will recognize that a III-V semiconductor refers to a compound obtained by combining group III elements, such as aluminum (Al), gallium (Ga), or indium (In), with group V elements, such as nitrogen (N), phosphorous (P), arsenic (As) or antimony (Sb) (e.g., GaN, InP, GaAs, or GaP).

Each semiconductor structure 100, 200, 300 can further include multiple epitaxially grown semiconductor layers on the substrate 101, 201, 301. These semiconductor layers can include, for example: an optional buffer layer (not specifically shown) on the top surface of the substrate 101, 201, 301; a channel layer 102, 202, 302 for HEMT(s) on the buffer layer (or substrate); and a barrier layer 103, 203, 303 for HEMT(s) on the channel layer 102, 202, 302. These epitaxial grown semiconductor layers can be, for example, III-V semiconductor layers. Specifically, the optional buffer layer can be employed to facilitate growth of the channel layer 102, 202, 302 and to provide for lattice constants of the substrate 101, 201, 301 below and the channel layer 102, 202, 302 above. The buffer layer can be doped or undoped. Optionally, the buffer layer can be carbon-doped. The barrier layer 103, 203, 303 can have a band gap that is wider than the bandgap of the channel layer 102, 202, 202 for the device channel. Those skilled in the art will recognize that the barrier and channel materials can be selected so that a heterojunction is formed at the interface between the two layers, thereby resulting in the formation of a two-dimensional electron gas (2DEG) in the channel layer 102, 202, 202. This 2DEG in the channel layer 102, 202, 302 can provide the conductive pathway for the drifting of charges between the source and the drain.

In some embodiments, the buffer layer could be a carbon-doped gallium nitride (C—GaN) buffer layer or a buffer layer of any other material suitable for use as a buffer layer of a HEMT. The channel layer 102, 202, 302 could be a GaN layer or a III-V semiconductor layer made of any other III-V semiconductor compound suitable for use as a channel layer in a HEMT. The barrier layer 103, 203, 303 could be an aluminum gallium nitride (AlGaN) barrier layer or a barrier layer of any other material suitable for use as a barrier layer in a HEMT. For purposes of illustration, the figures and the description above depict the epitaxially grown semiconductor layers (e.g., the buffer layer (not shown); the channel layer 102, 202, 302; and the barrier layer 103, 203, 303) as being single layered structures (i.e., comprising one layer of buffer material, one layer of channel material and one layer of barrier material). However, it should be understood that, alternatively, any one or more of the epitaxially grown layers could be multi-layered structures (e.g., comprising multiple sub-layers of different buffer materials, multiple sub-layers of different III-V semiconductor channel materials and/or multiple sub-layers of different barrier materials).

Each semiconductor structure 100, 200, 300 can include at least one e-mode HEMT 110, 210.1-210.2, 310.1-310.2.

Each e-mode HEMT 110, 210.1-210.2, 310.1-310.2 can include: source and drain terminals 121-122, 221-222, 321-322; an active device region 105, 205.1-205.2, 305.1-305.2 including a corresponding section of the channel layer 102, 202, 302 extending laterally between the source and drain terminals 121-122, 221-222, 321-322; and a corresponding e-mode HEMT gate 130, 230.1-230.2, 330.1-330.2, which is on a section of the barrier layer 103, 203, 303 and which traverses the active device region 105, 205.1-205.2, 305.1-305.2 parallel to and positioned laterally between the source and drain terminals 121-122, 221-222, 321-322.

The gate 130, 230.1-230.2, 330.1-330.2 of each e-mode HEMT 110, 210.1-210.2, 310.1-310.2 can include a semiconductor layer 132, 232, 332 on a section of the barrier layer 103. More specifically, within each e-mode HEMT, a section of the barrier layer 103, 203, 303 can include a first barrier portion 103T, 203T, 303T (also referred to herein as a thick barrier portion) and second barrier portions 103t, 203t, 303t (also referred to herein as thin barrier portions). The first barrier portion 103T, 203T, 303T can be positioned laterally between and can be thicker than the second barrier portions 103t, 203t, 303t. Additionally, the first barrier portion 103T, 203T, 303T can traverse the active device region and the second barrier portions 103*t*, 203*t*, 303*t* can extend laterally from opposing ends of the first barrier portion 103T, 203T, 303T beyond the side boundaries of the active device region. The semiconductor layer 132, 232, 332 can be a monocrystalline P-type III-V semiconductor layer. For example, the semiconductor layer 132, 232, 332 can be a Mg-doped GaN layer. Furthermore, the semiconductor layer 132, 232, 332 can include, above the first barrier portion 103T, 203T, 303T, a first semiconductor portion 132T, 232T, 332T (also referred to herein as a thick semiconductor portion) that is narrower in width than the first barrier portion 103T, 203T, 303T and second semiconductor portions 132*t*, 232*t*, 332*t* (also referred to herein as thin semiconductor portions). The first semiconductor portion 132T, 232T, 332T can be positioned laterally between and thicker than second semiconductor portions 132*t*, 232*t*, 332*t*. Additionally, as illustrated, essentially vertical surfaces of the second semiconductor portions 132*t*, 232*t*, 332*t* can be aligned with essentially vertical of the first barrier portion 103T, 203T, 303T below such that the second barrier portions 103*t*, 203*t*, 303*t* extend laterally beyond the semiconductor layer 132, 232, 332.

The gate 130, 230.1-230.2, 330.1-330.2 of each e-mode HEMT can further include a gate conductor layer 133, 233, 333 on the first semiconductor portion 132T, 232T, 332T. To form a Schottky contact gate terminal, which will control the 2DEG under the gate, the gate conductor layer 133, 233, 333 can include metal(s) or metal alloy(s) that will form such a Schottky contact (i.e., a potential energy barrier for electrons) at the gate conductor-semiconductor. Metals or metal alloys that could be employed for a Schottky contact gate terminal include, but are not limited to, gold (Au), titanium (Ti), titanium nitride (TiN), nickel-gold (Ni—Au), or titanium-platinum-gold (Ti/Pt/Au). In any case, the gate conductor layer 133, 233, 333 can be narrower in width that the first semiconductor portion 132T, 232T, 332T below (i.e., the first semiconductor portion can be wider than the gate conductor layer) such that the first semiconductor portion 132T, 232T, 332T extends laterally beyond the gate conductor layer 133, 233, 333 toward to the side boundaries of the active device region.

Optionally, the e-mode HEMT could, more specifically, be an e-mode metal-insulator-semiconductor HEMT (MISHEMT). In this case, the gate of each e-mode MISHEMT could further include a gate dielectric layer (not shown) in the stack below the gate conductor layer. The gate dielectric layer could be a silicon dioxide ($SiO_2$) layer, a high K dielectric layer or a layer of any other dielectric material suitable for use as a gate dielectric layer of a MISHEMT In this case, the gate conductor layer could include one layer or multiple sub-layers of any suitable gate conductor material (e.g., gate metal(s), gate metal alloy(s), doped polysilicon, etc.).

Thus, the gate 130, 230.1-230.2, 330.1-330.2 of each e-mode HEMT has stepped opposing end walls. That is, instead of having essentially vertical opposing end walls, each end wall of the gate has a step down from the gate conductor layer 133, 233, 333 to the top surface of the first semiconductor portion 132T, 232T, 332T, another step down to the top surface of the second semiconductor portion 132*t*, 232*t*, 332*t*, and another step down to the top surface of the second barrier portion 103*t*, 203*t*, 303*t*. Since the second barrier portions 103*t*, 203*t*, 303*t* at the ends of the gate are relatively thin, charge build up in the channel layer at the ends of the gate is minimal or eliminated, potentially eliminating any current path around the gate.

However, optionally, in order to block any such current path, each e-mode HEMT can further include isolation regions 141, 241, 341 in the channel layer 102, 202, 302 aligned below areas of the second barrier portions 103*t*, 203*t*, 303*t*, respectively, adjacent but offset from the opposing end walls of the gate 130, 230.1-230.2, 330.1-330.2 and, thereby offset from the semiconductor layer 132, 232, 332. The isolation regions 141, 241, 341 can be areas of the channel layer that contain and, particularly, that have been doped a dopant, such as argon, to eliminate charge build up and thereby block potential current path(s) between the source and drain terminals 121-122, 221-222, 321-322 that would otherwise bypass the portion of the channel layer below the gate by wrapping around the end(s) of the gate. Doping of the doped region (e.g., the argon-doped region) can be achieved, for example, using a dopant implantation process, such that the isolation regions are also referred to herein as implant isolation regions. It should be noted that, since charge build up will be limited due to the second barrier portions being relatively thin, the depth of the implant isolation regions can be relatively shallow. Additionally, it should be noted that the implant isolation regions can be formed so that they are completely offset from the gate and, particularly, from the semiconductor layer therein so as to avoid any gate degradation that could be caused by a dopant implantation process, thereby ensuring that the gate remains robust (i.e., less likely to suffer from reliability issues).

Each e-mode HEMT 110, 210.1-210.2, 310.1-310.2 can further include a conformal dielectric layer 151, 251, 351 (e.g., a conformal silicon nitride (SiN) layer or a conformal layer of some other suitable dielectric material) over the gate 130, 230.1-230.2, 330.1-330.2.

As mentioned above, each e-mode HEMT 110, 210.1-210.2, 310.1-310.2 can further include source and drain terminals 121-122, 221-222, 321-322 parallel to and on opposing sides of the gate 130, 230.1-230.2, 330.1-330.2. The source and drain terminals 121-122, 221-222, 321-322 can be separated from the gate by essentially the same separation distances or by different separation distances (e.g., as illustrated, the drain terminal 122, 222, 322 can be separated from the gate by a greater separation distance than the source terminal 121, 221, 321 for increased breakdown voltage). The source and drain terminals 121-122, 221-222, 321-322 can, for example, include ohmic contact source and drain terminals in source/drain openings that extend through the dielectric layer 151, 251, 351 and into the barrier layer 103, 203, 303 toward or to the channel layer 102, 202, 302. That is, the source/drain openings can extend through the dielectric layer and at least partially through the barrier layer toward the channel layer. In some embodiments, the source and drain terminals can be essentially T-shaped, each with a lower section in a source/drain opening and an upper section on and wider than the lower section (e.g., extending laterally onto the dielectric layer), as illustrated. Such ohmic contact source and drain terminals can include one or more layers of metal or metal alloys (e.g., such ohmic contact source and drain terminals include, but are not limited to, multi-layer structures of Ti/Al/TiN, Ti/Al/Ti/Au or Mo/Al/Mo/Au). It should be noted that the source and drain terminal configurations are provided above for illustration purposes and are not intended to be limiting. Alternatively, any other suitable source and drain terminal configuration for a HEMT could be employed.

As illustrated in FIGS. 1A-1C, the semiconductor structure 100 include an e-mode HEMT 110 with a gate 130 positioned laterally between discrete source and drain terminals 121-122. Interlayer dielectric (ILD) material 152 can cover the e-mode HEMT 110. The ILD material 152 can include, for example, one or more layers of dielectric material (e.g., silicon dioxide ($SiO_2$) or some other suitable ILD material). Contacts (e.g., gate contact(s) 199 and source and drain contacts 198) can extend through the ILD material 152 to the gate and source and drain terminals.

As illustrated in FIGS. 2A-2B and FIGS. 3A-3B, the semiconductor structure 200, 300 can include multiple HEMTs connected in parallel with shared source and drain terminals 221-222, 321-322. Specifically, the semiconductor structure 200, 300 can include alternating e-mode HEMTs 210.1-210.2, 310.1-310.2, as described above, and d-mode HEMT(s) 280, 380. In these embodiments, the barrier layer 203, 303 can include alternating first barrier portions 203T, 303T and second barrier portions 203$t$, 303$t$ with each first barrier portion 203T, 303T being positioned laterally between and thicker than two adjacent second barrier portions 203$t$, 303T. Additionally, the e-mode HEMTs 210.1-210.2, 310.1-310.2 can include gates 230.1-230.2, 330.1-330.2 on first barrier portions 203T, 303T, as discussed in detail above. Each d-mode HEMT (e.g., see d-mode HEMTs 280, 380) can be positioned laterally between a pair of e-mode HEMTs, as illustrated.

Referring to the semiconductor structure 200 of FIGS. 2A-2B, in this case, the d-mode HEMT 280 can include a corresponding active device region 206 in a section of the channel layer 202 positioned laterally between the active device regions 205.1 and 205.2 of the e-mode HEMTs 210.1-210.2 and extending between the source and drain terminals 221-222. A second barrier portion 203T can traverse the active device region 206 and the conformal dielectric layer 251 can cover the second barrier portion 203T. In this embodiment, the d-mode HEMT 280 can be devoid of a gate and, thus, always in an ON state. ILD material 252 can cover the various e-mode and d-mode HEMTs. The ILD material 252 can include, for example, one or more layers of dielectric material (e.g., $SiO_2$ or some other suitable ILD material). Contacts can extend through the ILD material 252 to the e-mode HEMT gates and to the source and drain terminals.

Referring to the semiconductor structure 300 of FIGS. 3A-3B, in this case, the d-mode HEMT 380 can similarly include a corresponding active device region 306 in a section of the channel layer 302 positioned laterally between the active device regions 305.1 and 305.2 of the e-mode HEMTs 310.1-310.2 and extending between the source and drain terminals 321-322. A second barrier portion 303T can traverse the active device region 306 and the conformal dielectric layer 351 can cover the second barrier portion 303T. In this embodiment, the d-mode HEMT 380 can include a gate 386 (referred to herein as an additional gate or a d-mode HEMT gate) to control the ON/OFF state of the d-mode HEMT 380. The gate 386 can be on the conformal dielectric layer 351 aligned above a second barrier portion 303T and positioned laterally between gates 330.1-330.2 (i.e., between the gates of two e-mode HEMTs 310.1-310.2). The gate 386 can include a gate conductor layer 383 on the second barrier portion 303T. The gate conductor layer 383 can include the same gate conductor material(s) as that used for the e-mode HEMT gates or, alternatively, can include different gate conductor material(s). ILD material 352 can cover the various e-mode and d-mode HEMTs. The ILD material 352 can include, for example, one or more layers of dielectric material (e.g., $SiO_2$ or some other suitable ILD material). Contacts can extend through the ILD material 352 to the e-mode and d-mode HEMT gates and to the source and drain terminals.

For purposes of illustration, the semiconductor structure 200 and 300 are shown as including a single d-mode HEMT between and sharing source and drain terminals with two e-mode HEMTs. However, it should be understood that the figures are not intended to be limiting. Alternatively, the semiconductor structures 200 and 300 could include any number of alternating e-mode and d-mode HEMTs.

Also disclosed herein are method embodiments for forming a semiconductor structure, such as the semiconductor structure 100 of FIGS. 1A-1C, that includes an e-mode HEMT having a robust gate and method embodiments for forming a semiconductor structure, such as the semiconductor structure 200 of FIGS. 2A-2B or the semiconductor structure 300 of FIGS. 3A-3B, that includes alternating e-mode and d-mode HEMTs with shared source and drain terminals, where the e-mode HEMTs similarly have robust gates.

Figure 4:
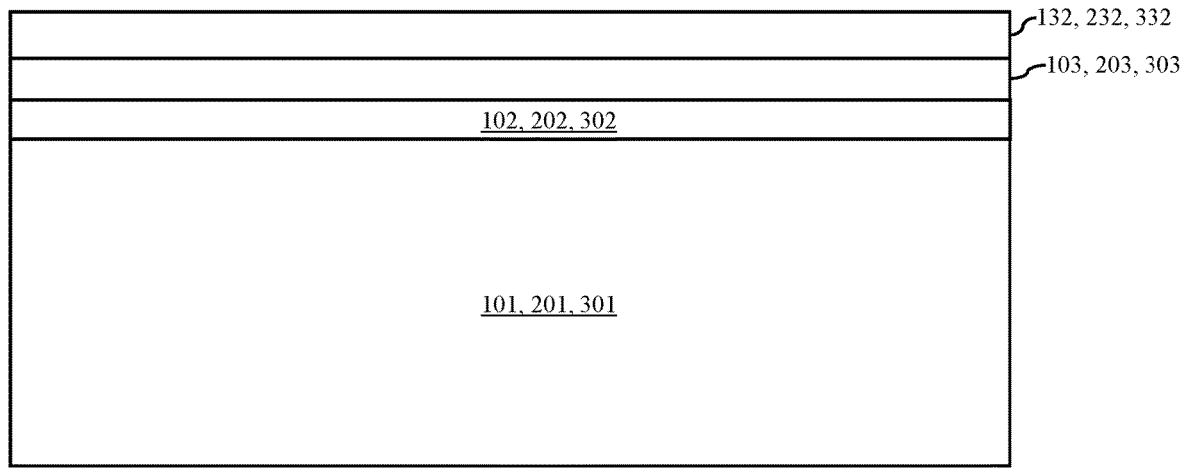
FIGS. 4-9 are cross-section diagrams illustrative of process steps in the formation of the semiconductor structure of FIGS. 1A-1C.

Each of the disclosed method embodiments can include forming a stack of epitaxially grown semiconductor layers on a substrate 101, 201, 301, as illustrated in FIG. 4. The substrate 101, 201, 301 can be, for example, a Si or Si-based substrate (e.g., a SiC substrate), a sapphire substrate, a III-V semiconductor substrate (e.g., a GaN substrate or some other suitable III-V semiconductor substrate) or any other suitable substrate for a III-V semiconductor device. The multiple epitaxially grown semiconductor layers can include, for example: an optional buffer layer (not specifically shown) on the top surface of the substrate 101, 201, 301; a channel layer 102, 202, 302 for HEMT(s) on the buffer layer (or substrate); and a barrier layer 103, 203, 303 for HEMT(s) on the channel layer 102, 202, 302. These epitaxial grown semiconductor layers can be, for example, III-V semiconductor layers. As discussed above, III-V semiconductor refers to a compound obtained by combining group III elements, such as Al, Ga, or In, with group V elements, such as N, P, As, or Sb (e.g., GaN, InP, GaAs, or GaP).

In some embodiments, the buffer layer could be a C—GaN buffer layer or a buffer layer of any other material suitable for use as a buffer layer of a HEMT. The channel layer 102, 202, 302 could be a GaN layer or a III-V semiconductor channel layer made of any other III-V semiconductor compound suitable for use as a channel layer in a HEMT. The barrier layer 103, 203, 303 could be a AlGaN barrier layer or a barrier layer of any other material suitable for use as a barrier layer in a HEMT. For purposes of illustration, the figures and the description above depict the epitaxially grown semiconductor layers (e.g., the buffer layer (not shown); the channel layer 102, 202, 302; and the barrier layer 103, 203, 303) as being single layered structures (i.e., comprising one layer of buffer material, one layer of channel material and one layer of barrier material). However, it should be understood that, alternatively, any one or more of the epitaxially grown layers could be multi-layered structures (e.g., comprising multiple sub-layers of different buffer materials, multiple sub-layers of different III-V semiconductor channel materials and/or multiple sub-layers of different barrier materials). These epitaxially grown semiconductor layers can also include a monocrystalline P-type III-V semiconductor layer 132, 232, 332 (e.g., a Mg-doped GaN layer) for e-mode HEMT gates to be formed during subsequent processing.

Figure 5:
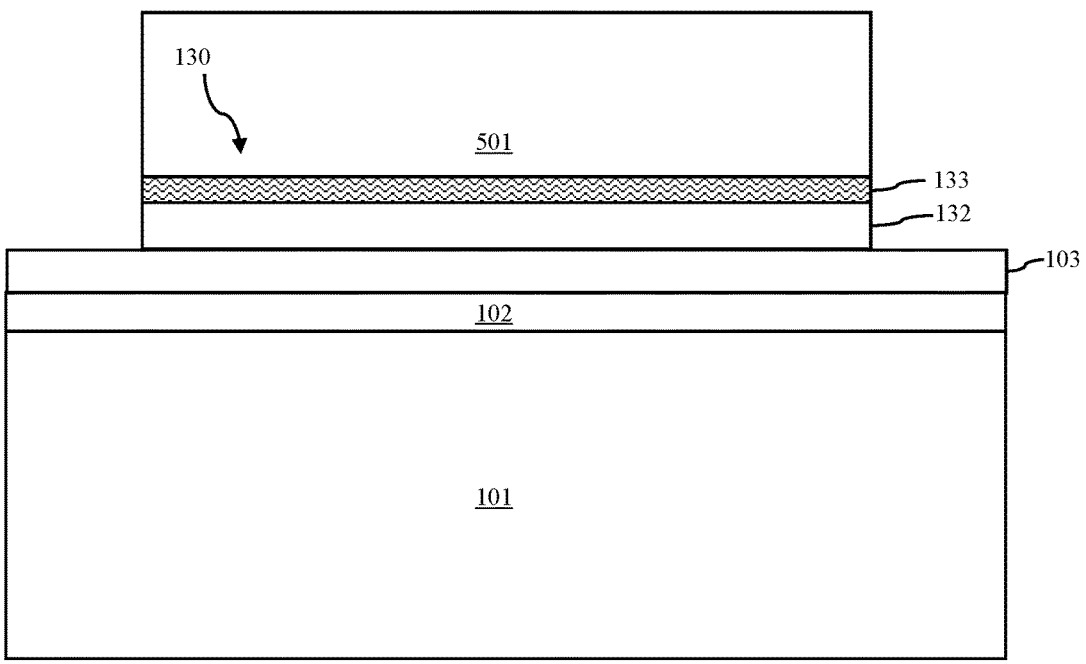
Figure 6:
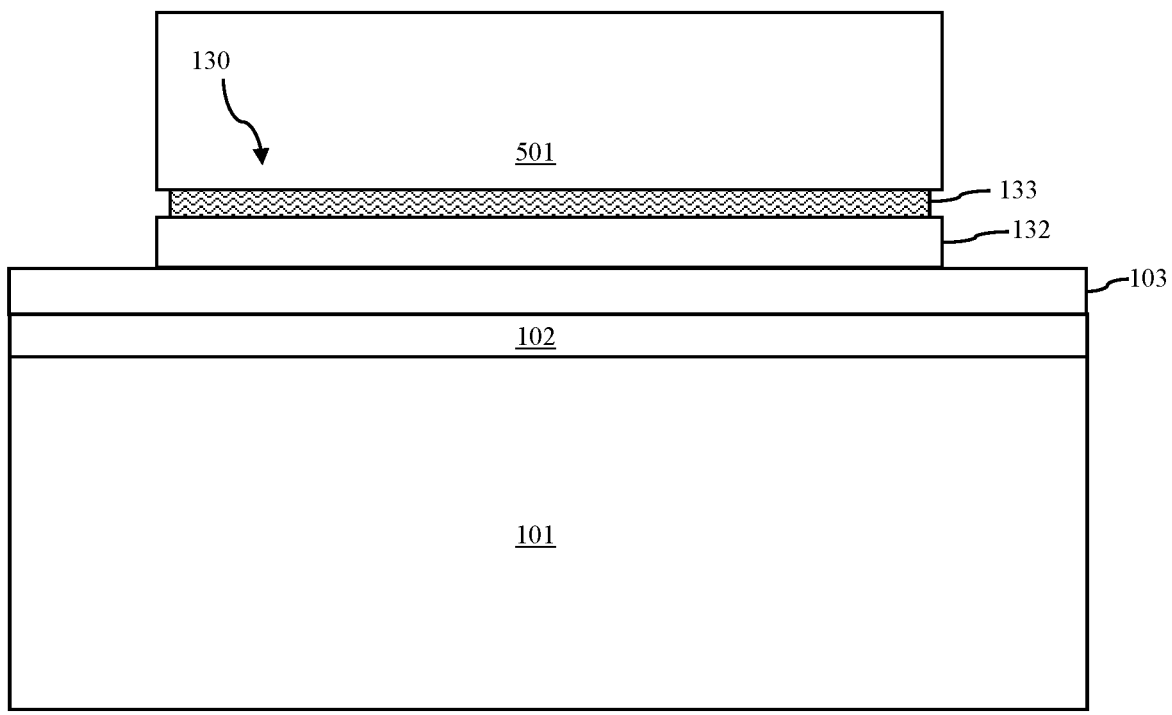

To form the semiconductor structure 100 of FIGS. 1A-1B, a gate conductor layer 133 can be formed on the semiconductor layer 132, as illustrated in FIG. 5. The gate conductor layer 133 can include metal(s) or metal alloy(s) that will form such a Schottky contact (i.e., a potential energy barrier for electrons) at the gate conductor-semiconductor. Metals or metal alloys that could be employed for a Schottky contact gate terminal include, but are not limited to, Au, Ti, TiN, Ni—Au, or Ti/Pt/Au. A mask 501 (e.g., a hardmask layer, such as a silicon nitride (SiN) hardmask layer) can subsequently be formed on the gate conductor layer 133 and lithographically patterned and etched into an essentially rectangular shape that extends laterally across a designated active device region. Exposed portions of the gate conductor layer 133-semiconductor layer 132 stack can then be removed (e.g., by one or more selective anisotropic etch processes) to form a gate 130 that extends laterally across the active device region. Following gate formation, a timed isotropic etch process that is selective for the gate conductor material (e.g., a timed wet etch process that is selective for TiN) can be performed to laterally etch back the exposed vertical surfaces of the gate conductor material so that edges of the semiconductor layer 132 are exposed, as illustrated in FIG. 6. The mask 501 can then be removed.

Figure 7:
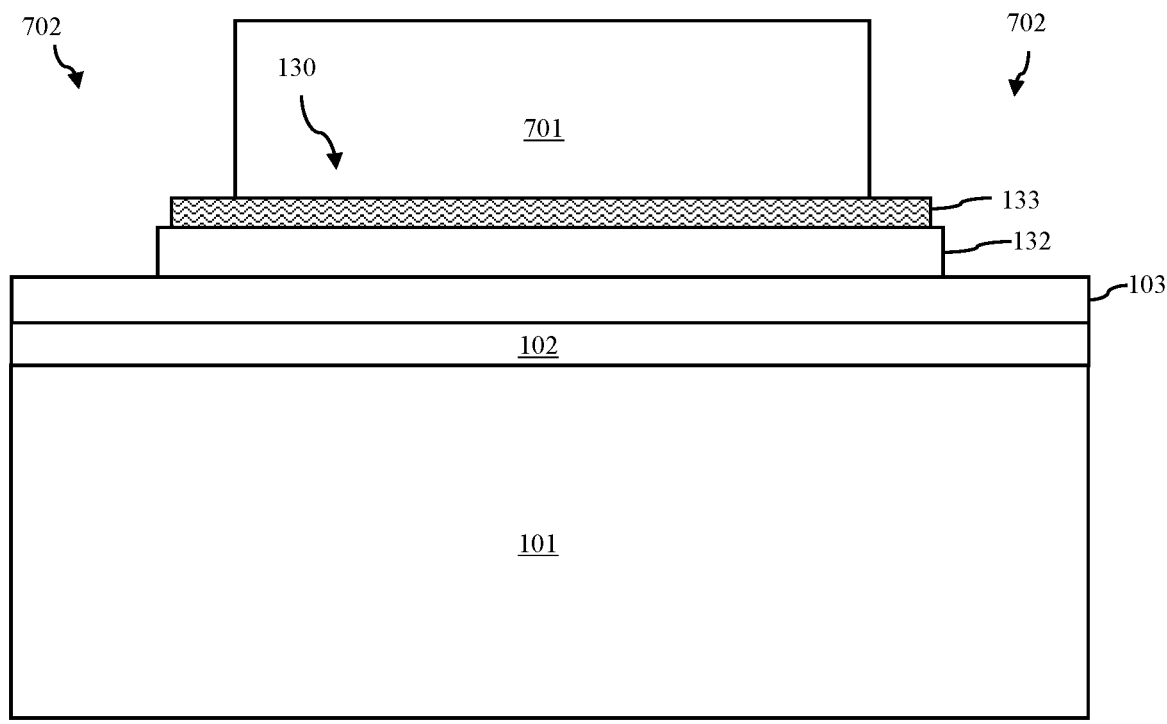
Figure 8:
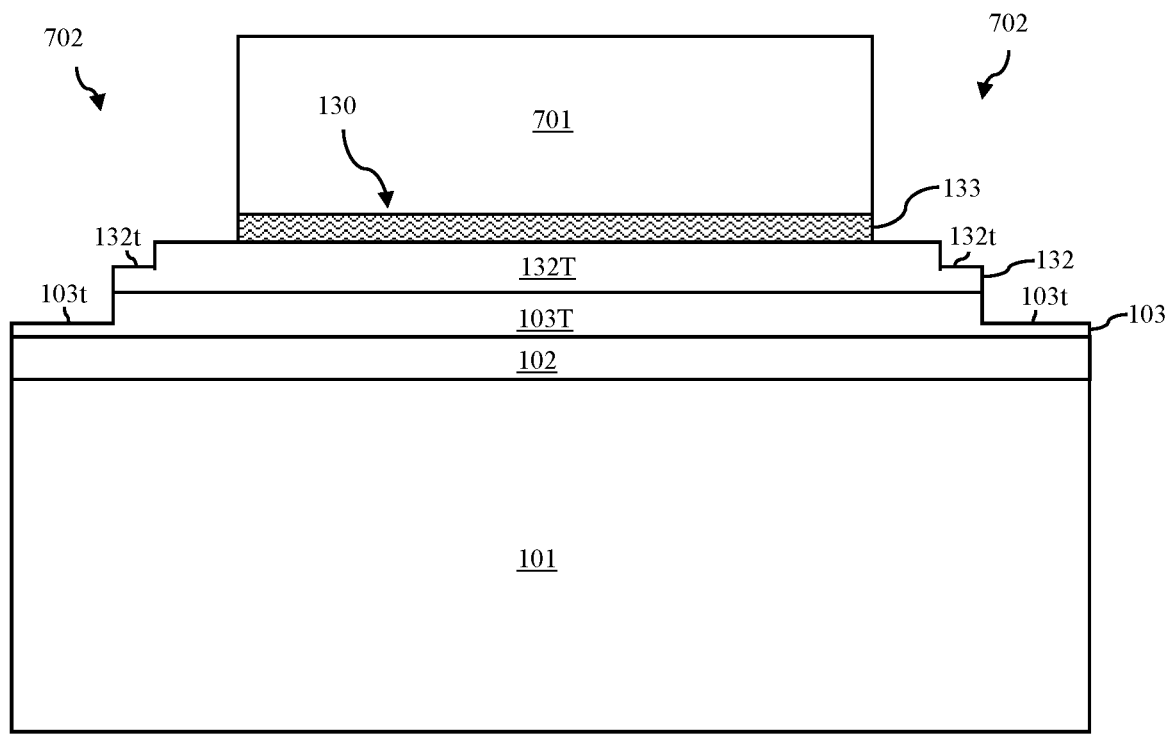

An additional masked etch process can be performed to remove end sections of the gate conductor layer 133 of the gate 130, as illustrated in FIGS. 7 and 8. Specifically, a mask 701 (e.g., another hardmask layer) can be formed on the gate conductor layer 133 and lithographically patterned and etched so as to have openings 702 that expose the end sections of the gate conductor layer 133 as well as surfaces of the semiconductor layer 132 and barrier layer 103 that extend laterally beyond those end sections. It should be noted that that mask 701 formation can be concurrent with mask formation for patterning resistors elsewhere on the substrate and formed of the same metal or metal alloy material (e.g., TiN) as that used for the gate conductor layer 133. An anisotropic etch process can be performed to remove the exposed end sections of the gate conductor layer 133. The etch specifications used can be non-selective for the gate conductor material such that exposed surfaces of the semiconductor layer 132 and barrier layer 103 are concurrently recessed, thereby modifying the gate so that it has stepped opposing end walls, as illustrated in FIG. 8. Such an etch process could be, for example, a reactive ion etch (RIE) process performed using chlorine (Cl). As a result, in the area of the gate 130, the barrier layer 103 has a first barrier portion 103T positioned laterally between and thicker than second barrier portions 103T. Additionally, within the gate 130, the semiconductor layer 132 has, above the first barrier portion 103T, a first semiconductor portion 132T positioned laterally between and thicker than second semiconductor portions 132T, and the gate conductor layer 133 is on but narrower in width than the first semiconductor portion 132T. The mask 701 can then be selectively removed.

Figure 9:
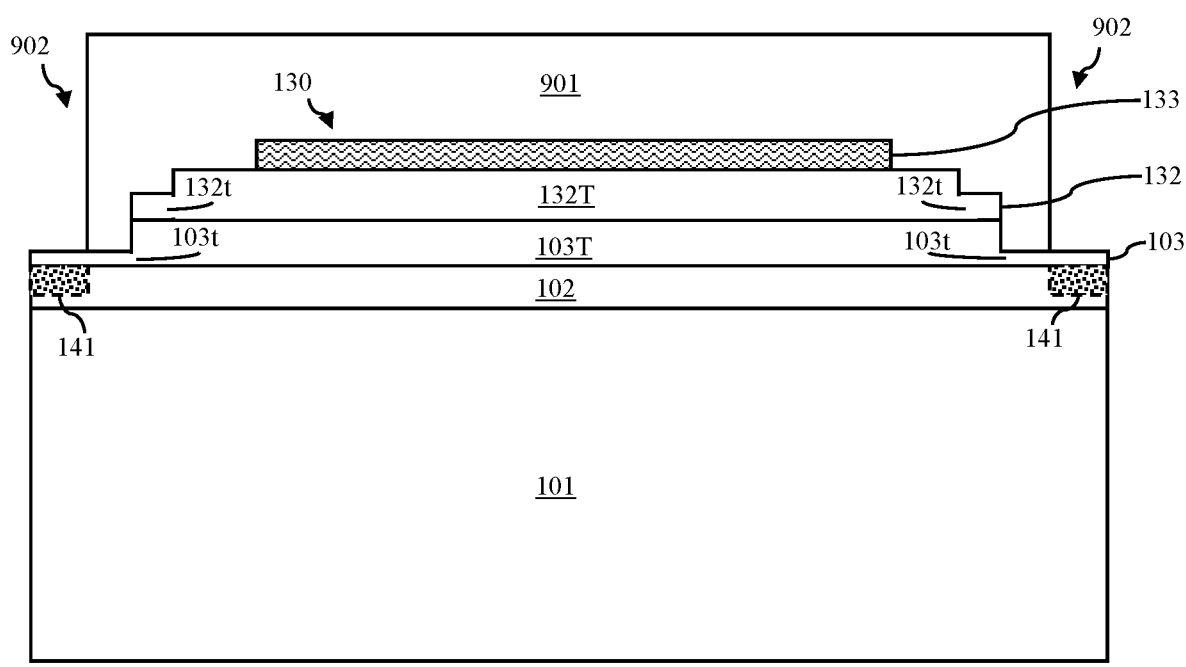

Optionally, following gate 130 formation, isolation regions 141 (e.g., implant isolation regions) can be formed, as illustrated in FIG. 9. Specifically, a mask 901 (e.g., another hardmask layer) can be formed over the partially completed structure and lithographically patterned and etched so as to form openings 902 that expose only areas of the second barrier portions 103t that are beyond the ends of semiconductor layer 132. Then, a dopant implantation process can be performed to implant a dopant, such as argon, into an area of the channel layer 102 aligned below the openings 902 and completely offset from the semiconductor layer 132, thereby forming the isolation regions 141. As discussed above, such isolation regions 141 can eliminate charge build up in the channel layer 102 near the ends of the gate 130 to block potential current paths around the gate 130. Since charge build up will be limited because the portions of the barrier layer 103 that extend beyond the ends of the gate 130 are relatively thin, the depth of the isolation regions 141 can be relatively shallow. Furthermore, since the mask 901 protects the semiconductor layer 132 during the dopant implantation process, gate degradation is avoided and the gate 130 remains robust (i.e., less likely to suffer from reliability issues). The mask 901 can then be removed.

Additional processing can be performed in order to complete the e-mode HEMT 110, as illustrated in FIGS. 1A-1C. For example, a conformal dielectric layer 151 (e.g., a conformal SiN layer or a conformal layer of some other suitable dielectric material) can be formed over the partially completed structure. Then, source and drain terminals 121-122 can also be formed. In some embodiments, formation of the source and drain terminals 121-122 can include forming source and drain openings (e.g., using lithographic patterning and etch processes). The source and drain openings can be formed so that they are parallel to and on opposing sides of the gate 130 (e.g., separated from the gate by the same separation distance or by different separation distances). The source and drain openings can be formed so that they that extend through the dielectric layer 151 and into the barrier layer 103 toward or to the channel layer 102. One or more layers of metal or metal alloys can then be deposited over the partially completed structure so as to fill the openings. These layers can be selected to form ohmic contact source and drain terminals and can include, for example, Ti/Al/TIN, Ti/Al/Ti/Au or Mo/Al/Mo/Au. The stack of metal or metal alloy layers can then be patterned (e.g., lithographically patterned and etched) to form the discrete source and drain terminals 121-122 (e.g., T-shaped source and drain terminals). Alternatively, any other suitable technique for forming source and drain terminals could be employed. Then, using conventional middle of the line (MOL) processing techniques, one or more layers of ILD material 152 can be deposited over the partially completed structure and contacts (e.g., gate contact(s) 199 and source and drain contacts 198) can be formed so that they extend through the ILD material 152 to the gate and source and drain terminals.

Figure 10:
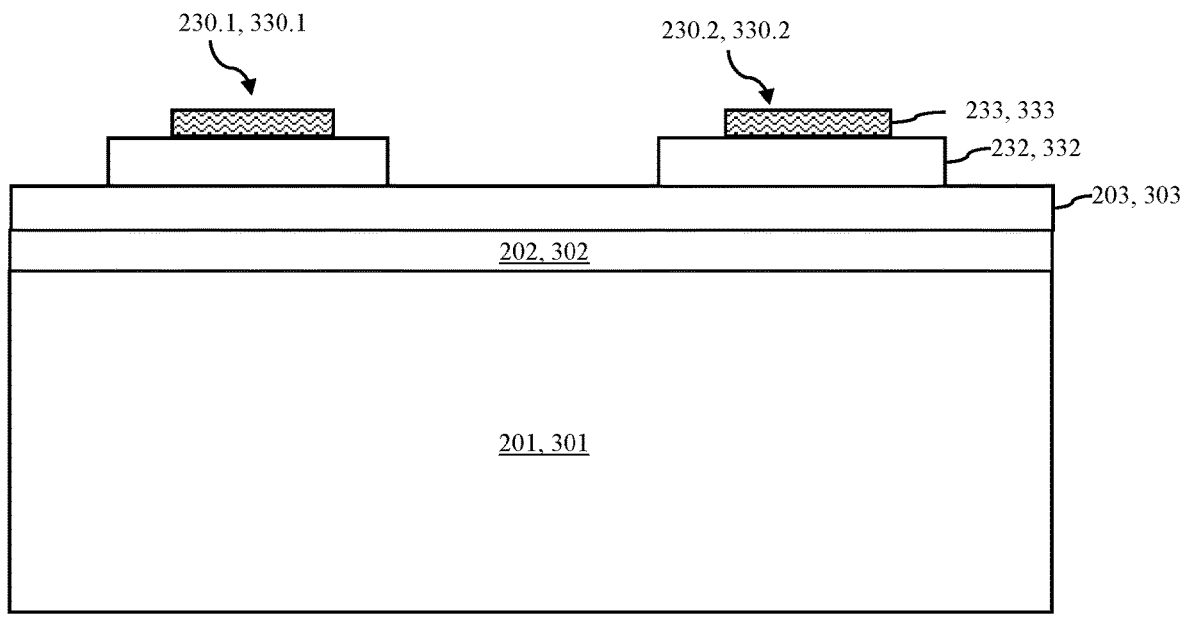
FIGS. 10-13 are cross-section diagrams illustrative of process steps in the formation of the semiconductor structures of FIGS. 2A-2B and 3A-3B.

To form the semiconductor structure 200 of FIGS. 2A-2B or the semiconductor structure 300 of FIGS. 3A-3B, a gate conductor layer 233, 333 can be formed on the semiconductor layer 232, 332 and, as illustrated in FIG. 10, the gate conductor layer-semiconductor layer stack can be lithographically patterned and etched to form discrete gates 230.1-230.2, 330.1-330.2 extending laterally across designated e-mode HEMT active device regions, respectively. The gates can, for example, be patterned so as to be in end-to-end alignment with each pair of adjacent gates being separated by a d-mode HEMT active device region. The gate conductor layer 233, 333 can include metal(s) or metal alloy(s) that will form such a Schottky contact (i.e., a potential energy barrier for electrons) at the gate conductor-semiconductor. Metals or metal alloys that could be employed for a Schottky contact gate terminal include, but are not limited to, Au, Ti, TiN, Ni—Au, or Ti/Pt/Au. Additionally, in the same manner as described above with regard to formation of the gate 130 in the semiconductor structure 100 of FIGS. 1A-1C, exposed vertical surfaces of the gate conductor material in each gate 230.1-230.2, 330.1-330.2 can also be laterally etched (e.g., using a timed selective isotropic etch process) so that edges of the semiconductor layer 232, 332 below are slightly exposed.

Figure 11:
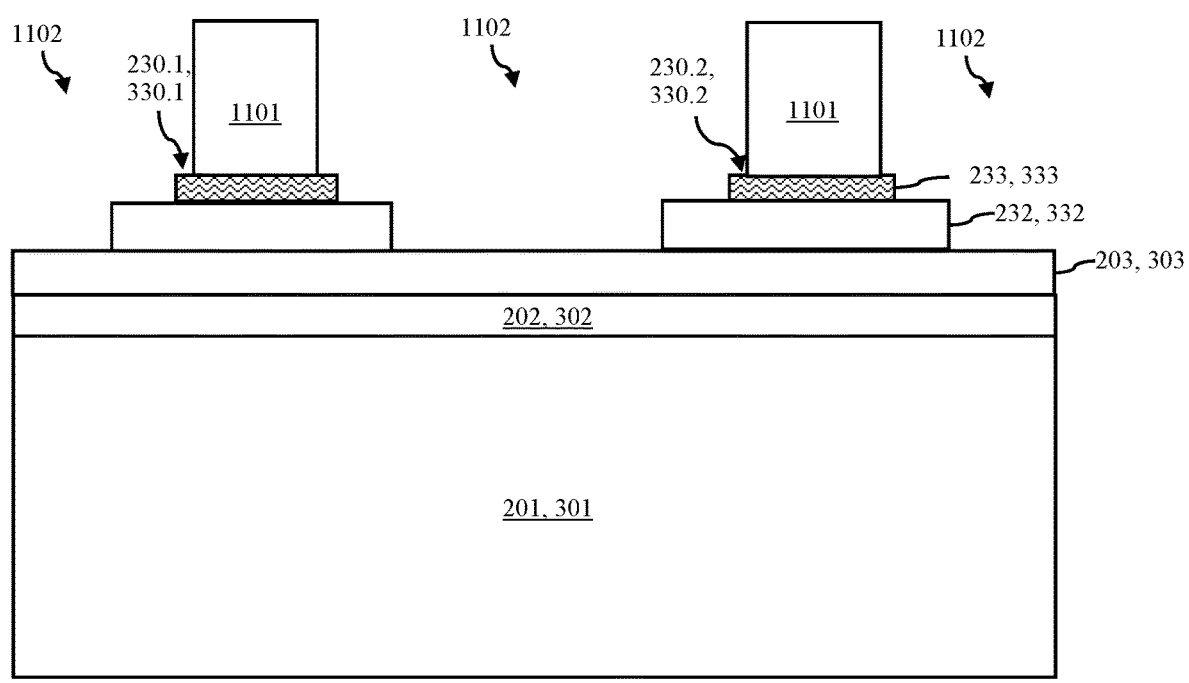
Figure 12:
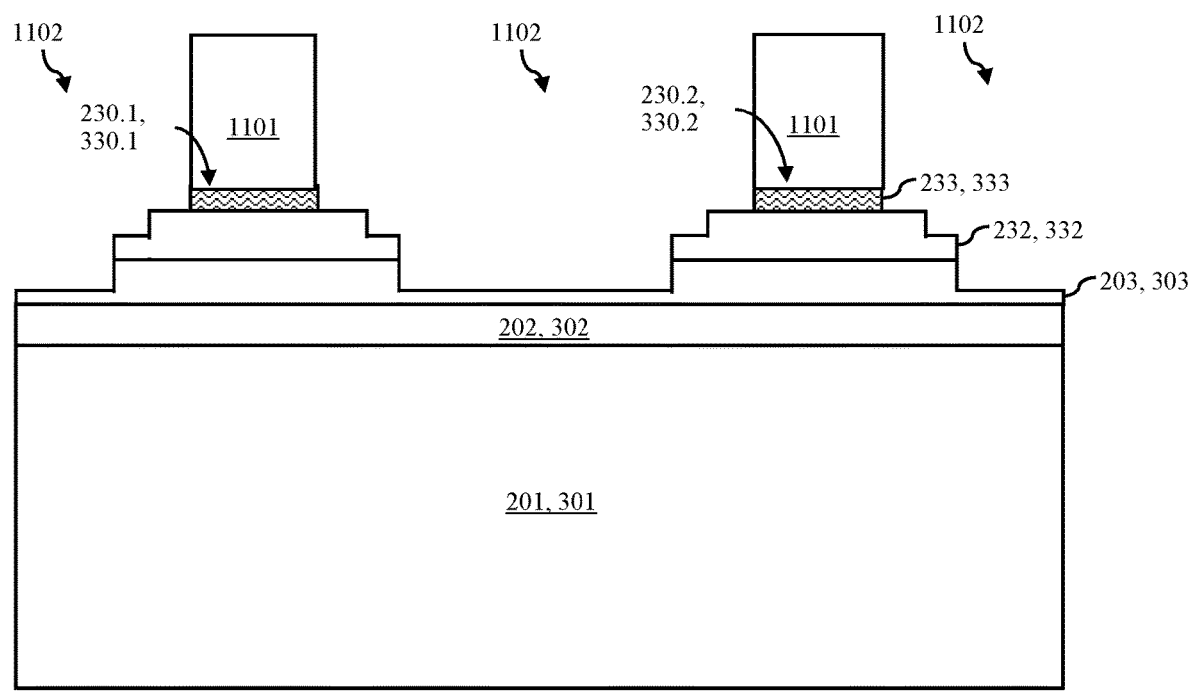

An additional masked etch process can be performed to remove the end sections of the gate conductor layer 233, 333 of each of the gates 230.1-230.2, 330.1-330.2, as illustrated in FIGS. 11 and 12. Specifically, a mask layer (e.g., a hardmask layer, such as a SiN hardmask layer) can be formed and lithographically patterned and etched so mask sections 1101 are on the center of the gate conductor layer 233, 333 of each of the gates 230.1-230.2, 330.1-330.2 and so openings 1102 expose end sections and surfaces of the semiconductor layer 232, 332 and barrier layer 203, 303 that extend laterally beyond those end sections (including the portion of the barrier layer between adjacent gates). An anisotropic etch process (e.g., an RIE process performed using Cl) can be performed to remove the exposed end sections of the gate conductor layers. The etch specifications used can be non-selective for the gate conductor material such that exposed surfaces of the semiconductor layer 232, 332 and barrier layer 203, 303 are concurrently recessed, thereby modifying each gate 230.1-230.2, 330.1-330.2 so that it has stepped opposing end walls, as illustrated in FIG. 12.

Figure 13:
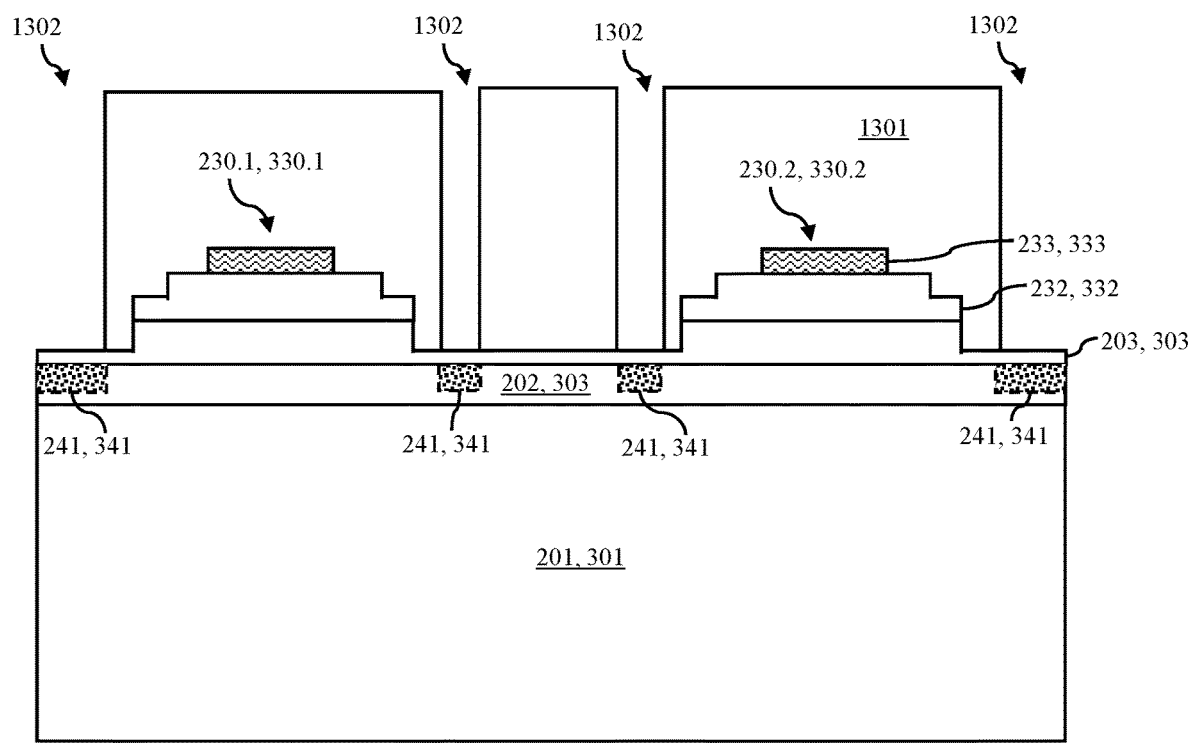

Optionally, following gate formation, isolation regions 241, 341 (e.g., implant isolation regions) can be formed, as illustrated in FIG. 13. Specifically, a mask 1301 (e.g., another hardmask layer) can be formed over the partially completed structure and lithographically patterned and etched so as to have openings 1302 that expose only areas in the thin portions of the barrier layer 203, 303 are beyond but adjacent to the opposing end walls of the gates. As illustrated, a center area of a thin portion of the barrier layer that extends between adjacent gates can remain covered by the mask. Then, a dopant implantation process can be performed to implant a dopant, such as argon, into areas of the channel layer 202, 302 aligned below the openings 1302, thereby forming isolation regions 241, 341. As discussed above, such isolation regions 241, 241 can eliminate charge build-up in the channel layer near the ends of the gates 230.1-230.2, 330.1-330.2 to block potential current paths around the gates. Since charge build up will be limited because the portions of the barrier layer that extend beyond the end walls of the gates are relatively thin, the depth of the isolation regions can be relatively shallow. Furthermore, since the mask 1301 protects the semiconductor layer within each gate, gate degradation is avoided and the gates 230.1-230.2, 330.1-330.2 remain robust (i.e., less likely to suffer from reliability issues). The mask 1301 can then be removed.

Additional processing can be performed in order to complete the e-mode HEMTs 230.1-230.2, 330.1-330.2 and the d-mode HEMT 280, 380 therebetween, as illustrated in FIGS. 2A-2B and 3A-3B. For example, a conformal dielectric layer 251, 351 (e.g., a conformal SiN layer or a conformal layer of some other suitable dielectric material) can be formed over the partially completed structure. Optionally, as illustrated in the semiconductor structure 300 of FIGS. 3A-3B, a d-mode HEMT gate 386 can be formed (e.g., deposited and patterned) on the top surface of the dielectric layer 351 between the gates 330.1-330.2. The gate 386 can include a gate conductor layer 383 of the same gate conductor material(s) as that used for the e-mode HEMT gates or, alternatively, can include different gate conductor material(s). Then, shared source and drain terminals 221-222, 321-322 for the e-mode HEMTs 210.1-210.2, 310.1-310.2 and for the d-mode HEMT 280, 380 therebetween can be formed. Such shared source and drain terminals 221-222, 321-322 can be formed, for example, in the same manner as the source and drain terminals 121-122 described in detail above. Following source and drain terminal formation, one or more layers of ILD material 252, 352 can be deposited over the partially completed structure and contacts can be formed so that they extend through the ILD material 252, 352 to the gates and source and drain terminals of the HEMTs.

It should be understood that in the structures and method described above, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration and are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a barrier layer having a first barrier portion within an active device region and second barrier portions external to side boundaries of the active device region, wherein the first barrier portion is positioned laterally between and thicker than the second barrier portions; and
   a source terminal and a drain terminal extending at least partially through the barrier layer, wherein the source terminal and the drain terminal are immediately adjacent to the first barrier portion and traverse the active device region;
   a gate within the active device region and positioned laterally between the source terminal and the drain terminal, wherein the gate has stepped opposing end walls adjacent side boundaries of the active device region, and wherein the gate includes:
     a semiconductor layer on the first barrier portion, wherein the semiconductor layer has, above the first barrier portion, a first semiconductor portion and second semiconductor portions, and wherein the first semiconductor portion is positioned laterally between and thicker than the second semiconductor portions; and
     a gate conductor layer on the first semiconductor portion, wherein the first semiconductor portion is wider than the gate conductor layer and the gate conductor layer only partially traverses the active device region in a direction parallel to the source terminal and the drain terminal and is spaced apart from the side boundaries of the active device region.

2. The structure of claim 1, further comprising:
   a channel layer, wherein the barrier layer is on the channel layer; and
   isolation regions in the channel layer below the second barrier portions and completely offset from the gate conductor layer.

3. The structure of claim 2, wherein the isolation regions include argon-doped regions.

4. The structure of claim 2, wherein the isolation regions are offset from the semiconductor layer.

5. The structure of claim 1, wherein the semiconductor layer includes a P-type III-V semiconductor layer.

6. The structure of claim 1,
   wherein the barrier layer includes an aluminum gallium nitride layer,
   wherein the semiconductor layer includes a magnesium-doped gallium nitride layer, and
   wherein the gate conductor layer includes a titanium nitride layer.

7. The structure of claim 1, wherein side surfaces of the gate conductor layer and the first semiconductor portion facing the source terminal and the drain terminal are vertically aligned.

8. A structure comprising:
   a barrier layer with alternating first barrier portions and second barrier portions, wherein the first barrier portions are within active device regions of enhancement mode transistors and the second barrier portions are external to side boundaries of the active device regions of the enhancement mode transistors, and wherein each first barrier portion is positioned laterally between and thicker than adjacent second barrier portions;
   a source terminal and a drain terminal extending at least partially through the barrier layer, wherein the source terminal and the drain terminal are immediately adjacent to the first portions and traverse at least the active device regions of the enhancement mode transistors and an active device region of a depletion mode transistor between the enhancement mode transistors;
   gates within the active device regions of the enhancement mode transistors, respectively, wherein the gates are positioned laterally between the source terminal and the drain terminal, and wherein each gate within a corresponding active device region has stepped opposing end walls adjacent side boundaries of the corresponding active device region and includes:
     a semiconductor layer on a first barrier portion, wherein the semiconductor layer has, above the first barrier portion, a first semiconductor portion and second semiconductor portions and wherein the first semiconductor portion is positioned laterally between and thicker than the second semiconductor portions; and
     a gate conductor layer on the first semiconductor portion, wherein the first semiconductor portion is wider than the gate conductor layer and the gate conductor layer only partially traverses the corresponding active device region in a direction parallel to the source terminal and the drain terminal and is spaced apart from the side boundaries of the corresponding active device region; and
   a conformal dielectric layer over the gates and further on the second barrier portions on opposing sides of the gates.

9. The structure of claim 8, further comprising:
   a channel layer, wherein the barrier layer is on the channel layer; and isolation regions in the channel layer below the second barrier portions and completely offset from the gate conductor layer of each gate.

10. The structure of claim 9, wherein the isolation regions include argon-doped regions.

11. The structure of claim 9, wherein the isolation regions are offset from the semiconductor layer of each gate.

12. The structure of claim 8, wherein the semiconductor layer of each gate includes a P-type III-V semiconductor layer.

13. The structure of claim 8,
wherein the barrier layer includes an aluminum gallium nitride layer,
wherein the semiconductor layer of each gate includes a magnesium-doped gallium nitride layer, and
wherein the gate conductor layer of each gate includes a titanium nitride layer.

14. The structure of claim 8, wherein side surfaces of the gate conductor layer and the first semiconductor portion facing the source terminal and the drain terminal are vertically aligned.

15. The structure of claim 8, further comprising: an additional gate on the conformal dielectric layer aligned above a second barrier portion between two of the gates.

16. A method comprising:
forming a barrier layer having a first barrier portion within an active device region and second barrier portions external to side boundaries of the active device region, wherein the first barrier portion is positioned laterally between and thicker than the second barrier portions;
forming a source terminal and a drain terminal extending at least partially through the barrier layer, wherein the source terminal and the second terminal are immediately adjacent to the first barrier portion and traverse the active device region; and
forming a gate within the active device region and positioned laterally between the source terminal and the drain terminal, wherein the gate has stepped opposing end walls adjacent side boundaries of the active device region, and wherein the gate includes:
a semiconductor layer on the first barrier portion, wherein the semiconductor layer has, above the first barrier portion, a first semiconductor portion and second semiconductor portions, and wherein the first semiconductor portion is positioned laterally between and thicker than the second semiconductor portions; and
a gate conductor layer on the first semiconductor portion, wherein the first semiconductor portion is wider than the gate conductor layer and the gate conductor layer only partially traverses the active device region in a direction parallel to the source terminal and the drain terminal and is spaced apart from the side boundaries of the active device region.

17. The method of claim 16, wherein the forming of the gate includes:
forming the semiconductor layer on the barrier layer;
forming the gate conductor layer on the semiconductor layer to form a gate conductor layer-semiconductor layer stack;
patterning the gate conductor layer-semiconductor layer stack;
laterally etching vertical surfaces of the gate conductor layer to expose edge portions of the semiconductor layer;
forming a mask layer on the gate conductor layer so end sections of the gate conductor layer are exposed; and
etching away the end sections of the gate conductor layer and concurrently recessing exposed surfaces of the second semiconductor portions and the second barrier portions.

18. The method of claim 17, wherein the barrier layer is above a channel layer and wherein the method further includes forming isolation regions in the channel layer below the second barrier portions, respectively.

19. The method of claim 18, wherein the forming of the isolation regions includes forming implant isolation regions offset from the semiconductor layer.

20. The method of claim 17, wherein the semiconductor layer comprises a P-type III-V semiconductor layer.

\* \* \* \* \*